US009093461B2

(12) United States Patent
Tageman

(10) Patent No.: US 9,093,461 B2
(45) Date of Patent: Jul. 28, 2015

(54) TIE BAR RESONANCE SUPPRESSION

(75) Inventor: Ola Tageman, Göteborg (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 57 days.

(21) Appl. No.: 14/110,963

(22) PCT Filed: May 17, 2011

(86) PCT No.: PCT/EP2011/057928
§ 371 (c)(1),
(2), (4) Date: Oct. 10, 2013

(87) PCT Pub. No.: WO2012/155962
PCT Pub. Date: Nov. 22, 2012

(65) Prior Publication Data
US 2014/0158421 A1   Jun. 12, 2014

(51) Int. Cl.
*H05K 1/16* (2006.01)
*H01L 23/66* (2006.01)
*H01L 23/498* (2006.01)
*H01L 23/50* (2006.01)
*H05K 1/02* (2006.01)

(52) U.S. Cl.
CPC .......... *H01L 23/66* (2013.01); *H01L 23/49861* (2013.01); *H01L 23/50* (2013.01); *H01L 2924/0002* (2013.01); *H01L 2924/19041* (2013.01); *H01L 2924/19042* (2013.01); *H01L 2924/19043* (2013.01); *H01L 2924/19105* (2013.01); *H05K 1/0296* (2013.01); *H05K 1/167* (2013.01)

(58) Field of Classification Search
CPC ............................ H05K 1/167; H05K 1/0296
USPC .................................................. 174/255, 260
See application file for complete search history.

(56) References Cited

U.S. PATENT DOCUMENTS

2006/0145341 A1   7/2006 Jiang et al.
2008/0273311 A1*  11/2008 Biunno ......................... 361/748

FOREIGN PATENT DOCUMENTS

WO          0156083    A2    8/2001

* cited by examiner

*Primary Examiner* — Hung V Ngo
(74) *Attorney, Agent, or Firm* — Coats & Bennett, PLLC

(57) ABSTRACT

An electronic circuit (200, 300, 400, 500) which comprises a flat circuit board with a layer of a non-conducting material with opposing first and second main surfaces, with a central ground pad arranged on a part of the first main surface and a ground plane arranged on the second main surface which protrudes beyond the central ground pad. There is a flat no leads package (100) arranged on the central ground pad. The flat no leads package (100) comprises a central plate (105) with protrusions (110, 120, 130, 140) which protrude beyond the central ground pad and overlap the ground plane (210). The electronic circuit (200, 300, 400, 500) comprises a grounding network (235, 240, 245, 230; 405, 435; 535, 545) connected to the ground plane (213) and to at least one protrusion (110, 120, 130, 140), thereby connecting the at least one protrusion (110, 120, 130, 140) electrically to the ground plane (210).

7 Claims, 3 Drawing Sheets

TIE BAR RESONANCE SUPPRESSION

TECHNICAL FIELD

The present invention discloses an electronic circuit with a flat lead package with improved tie bar resonance suppression.

BACKGROUND

So called "flat no lead packages" are becoming increasingly popular in microwave products due to, for instance, their small size, low inductance leads, and their advantageous heat sink properties. Examples of flat no lead packages are so called Quad Flat No leads packages, usually abbreviated as QFN-packages, and Dual Flat No leads packages, usually abbreviated as DFN-packages. Another term which is sometimes used for a flat no leads package is "MicroLeadFrame".

A flat no leads package usually comprises a conducting central plate and a plurality of conducting leads which surround the central plate but are separated from it by a non-conducting material. The conducting leads form I/O ports to components outside of the flat no leads package. The flat no leads package is usually arranged on top of a circuit board, so that the conducting leads can be used as I/O-ports from the flat no leads package to the circuit board.

A drawback associated with flat no lead packages is that they exhibit so called "tie-bars", which are needed during the manufacturing process, and which cannot be removed later, except at great cost. The tie-bars protrude from the central plate of the flat no lead package, and overlap the ground plane mentioned above, i.e. a ground plane which is usually comprised in the circuit board or arranged "below" it, as seen from the flat no lead package.

In order to understand the negative impact of the tie bars, they can be likened to a resonant stub which is short-circuited at its one end and open at its other end. Such a stub will resonate at $\lambda/4$, $3\lambda/4$, $5\lambda/4$, etc, where $\lambda$ is the wavelength which corresponds to the frequency of the signals in the flat no lead package. Tie-bar resonances can lead to a number of problems. They can, for example, create increased leakage from one I/O-port to another, in some cases as much as 20-30 dB. Another problem is that they can lead to sharp dips in the gain of a packaged device, and to corresponding rapid variations in the group delay of the device.

SUMMARY

It is a purpose of the invention to obviate at least some of the problems caused by tie bars in flat no leads packages arranged on circuit boards.

This purpose is obtained by means of disclosing an electronic circuit which comprises a flat circuit board which in turn comprises a layer of a non-conducting material with opposing first and second main surfaces, with a central ground pad being arranged on a part of the first main surface and a ground plane being arranged on the second main surface so as to protrude beyond the central ground pad.

The electronic circuit also comprises a "flat no leads package" arranged on the central ground pad. The flat no leads package comprises a central plate which in turn comprises one or more protrusions which protrude from the central plate beyond the central ground pad and overlap the ground plane.

The electronic circuit in addition comprises a grounding network which is connected to the ground plane and which is also electrically connected to at least one of the protrusions, thereby connecting the at least one protrusion electrically to the ground plane.

By means of the grounding network, the resonances caused by the protrusion or protrusions, e.g. in the form of tie-bars, can be dampened to a high degree, or, alternatively, moved to frequencies where their impact is not significant. The resonances' behavior is highly dependent on the impedance loading created by the grounding network, which is frequency dependent, and which can thus be designed to move the resonances to a desired frequency. Dampening or attenuation of the resonances will be caused by means of losses in the grounding network, since those losses will reduce the Q-value of the tie-bar. Hence, a grounding network with high losses will cause a higher degree of dampening than a grounding network with low losses. If it is desired to cause dampening of the resonances, it is thus advantageous to make the grounding network lossy.

Losses in the grounding network can be generated in different ways: they can be due to conductor losses or dielectric losses, and in some cases radiation losses. The losses can be deliberate, such as for resistors, or they can be inherent losses such as those in, for example, inductors, capacitors, transmission lines, etc.

In embodiments, the grounding network is connected to the protrusion by means of being arranged on the layer of non-conducting material to be overlapped by the protrusion, thereby providing a capacitive, i.e. non-touching, coupling to the protrusion.

In embodiments, the grounding network connects to the protrusion by means of a galvanic connection to the protrusion.

In embodiments, the grounding network is connected to the ground plane by means of a capacitive non-touching coupling to the ground plane.

In embodiments, the grounding network is connected to the ground plane by means of a galvanic coupling to the ground plane. In some such embodiments, the galvanic coupling is by means of a via hole connection through the layer of non-conducting material.

In embodiments, the grounding network is connected to the ground plane by means of a resistor.

In embodiments, the grounding network is connected to the ground plane by means of an inductor.

In embodiments, the grounding network is connected to the ground plane by means of a capacitor.

BRIEF DESCRIPTION OF THE DRAWINGS

The invention will be described in more detail in the following, with reference to the appended drawings, in which.

DETAILED DESCRIPTION

Figure 1:
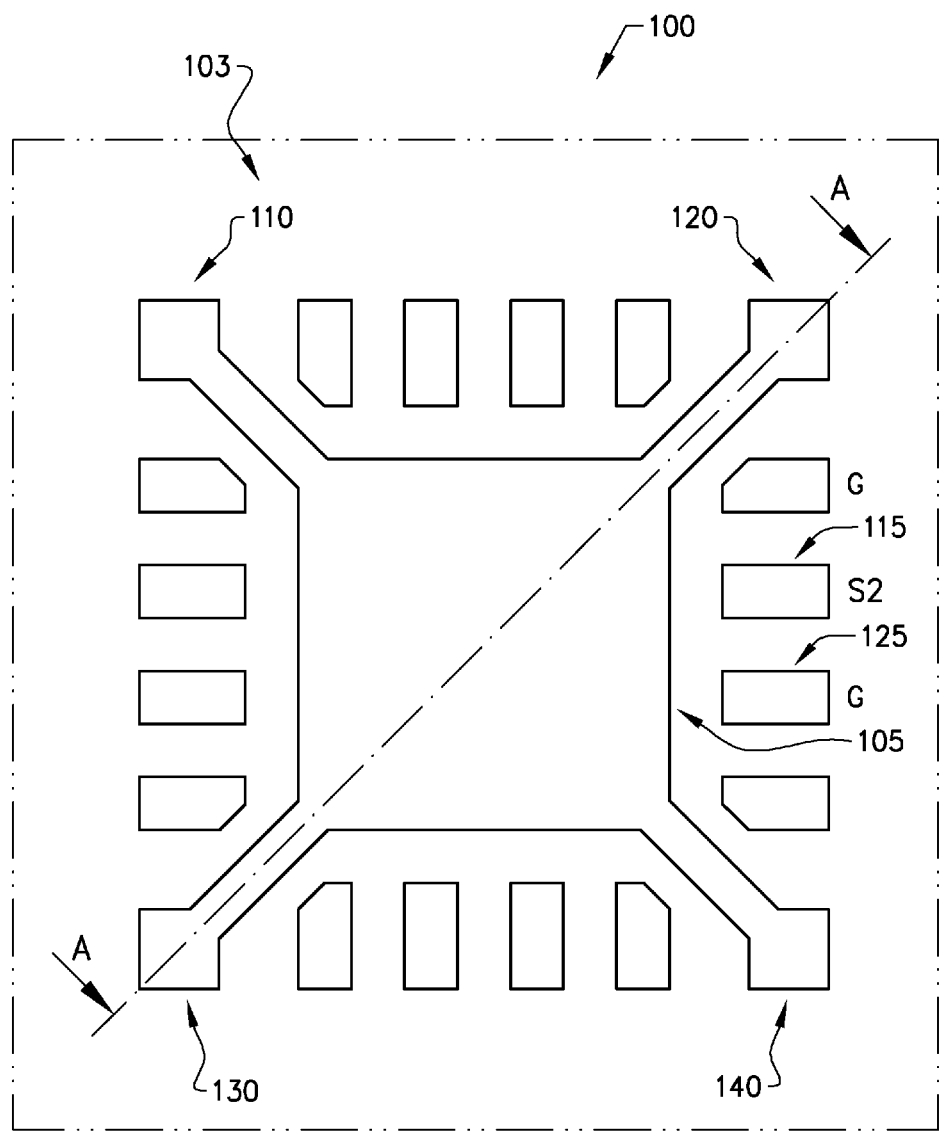
FIG. 1 shows a top view of a prior art quad flat no leads circuit.

Embodiments of the present invention will be described more fully hereinafter with reference to the accompanying drawings, in which embodiments of the invention are shown. The invention may, however, be embodied in many different forms and should not be construed as being limited to the embodiments set forth herein. Like numbers in the drawings refer to like elements throughout.

The terminology used herein is for the purpose of describing particular embodiments only, and is not intended to limit the invention.

FIG. 1 shows a top view of a (prior art) Flat No Leads frame package 100, here exemplified by a so called Quad Flat No Leads package, usually abbreviated as a "QFN package". This is only an example of a Flat No Leads package, the invention is equally applicable to other kinds of Flat No Leads packages, such as, for example, Dual Flat No Leads packages, abbreviated as DFN. It should be pointed out that a QFN-package usually also includes a plastic mold which surrounds the package, indicated as 103 in FIG. 1. For reasons of clarity, the plastic material will not be shown in the cross-sectional drawings in FIGS. 2-7.

The QFN package 100 comprises a central plate 105, around which there are a number of leads, two of which have been numbered 115 and 125. The leads 115, 125 and the central plate 105 are encapsulated in a non-conducting material 103, usually a plastic molding material. Tie bars 110, 120, 130, 140 are also shown.

The leads 105, 115, 125, form the input/output-pins between a component (not shown in the drawings) such as, for example, an integrated circuit inside the QFN package 100 and other circuits outside of the package.

The leads are also connected, as will be shown later, to a circuit board arranged on the other side (with respect to the circuits mentioned) of the QFN package 100. The leads can either be connected to a central ground pad on the circuit board or to a ground plane in the circuit board, for which reason lead 125 has been indicated as "G" in FIG. 1, i.e. "Ground", whereas lead 115 is indicated as "S2", i.e. "signal connection no. 2".

Figure 2:
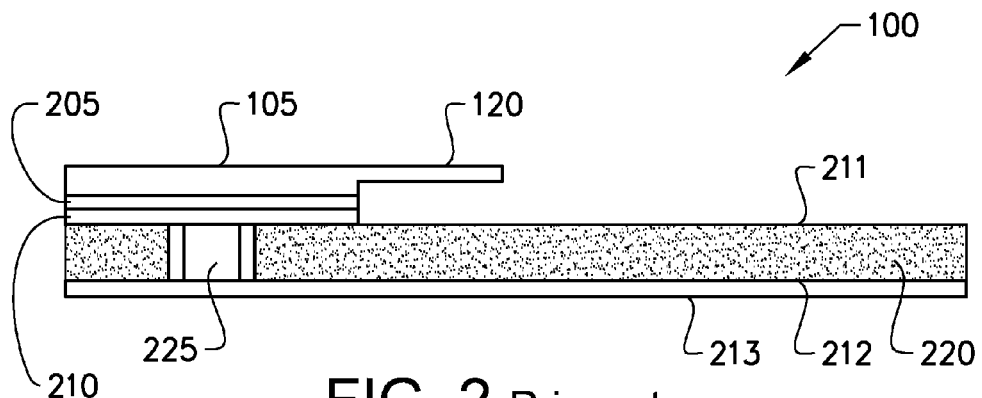
FIG. 2 shows a cross section of an electronic circuit which comprises the flat no leads circuit from FIG. 1 opened along the line A-A.

FIG. 2 shows an electronic circuit 200 which comprises the QFN package 100 from FIG. 1 opened along the line marked as A-A in FIG. 1, arranged on a plane circuit board, according to prior art. Here we see the central plate 105, as well as the tie bar 120. Also visible in this opened view is the plane circuit board on which the QFN package 100 is arranged: the circuit board comprises a layer 220 of non-conducting material, which is flat and which thus has a first 211 and a second 212 main surface. On a part of the first main surface 211, there is arranged a central ground pad 210, and on the second main surface 212 there is arranged a ground plane 213. Since the central ground pad 210 is arranged only on a part of the first main surface, the ground plane 213 will protrude farther than the central ground pad 210, i.e. beyond the central ground pad. The central ground pad 210 is sometimes also referred to by other terms, such as, for example, "central ground area", "main ground pad", "foot-print ground area", "central pad", "main area" or "ground pad".

Also shown in FIG. 2 is a layer 205 of "attachment material", such as, for example, solder paste or glue, by means of which the QFN package 100 is fixed to the circuit board. Also shown in FIG. 1 is a so called via connection 225, by means of which a point in the central ground pad 210 is connected to the ground plane 213. Additional vias can be used for additional such connections. Such a via connection is also sometimes referred to as a "via hole" or a "via hole connection".

As seen in FIG. 2, the central ground pad 210 is arranged on the first main surface 211 of the layer 220 of non conducting material so that a part of the layer 220 and the ground plane 213 extends "beyond" the central ground pad 210. In a similar manner, the tie-bar 120 extends "beyond" the central ground pad 210 and thereby in part overlaps the ground plane 213 without overlapping the central ground pad 210.

Figure 3:
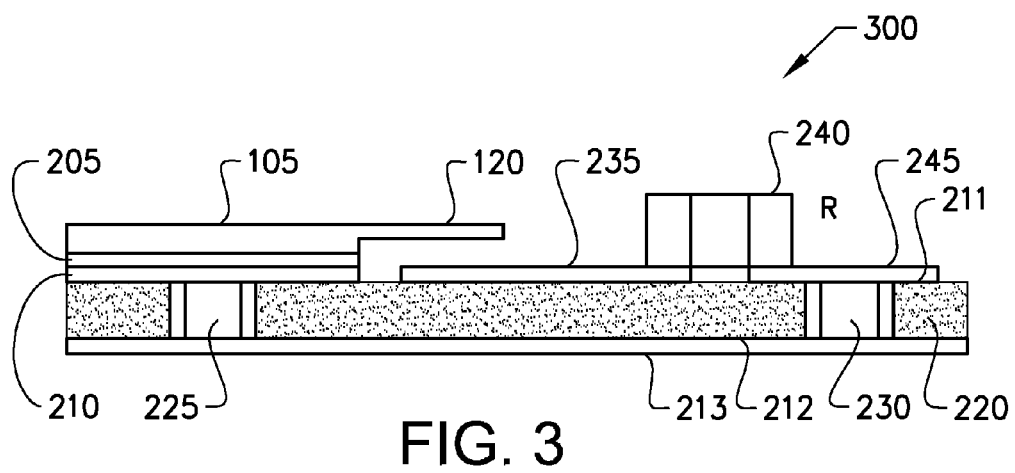
FIGS. 3-7 show different embodiments of circuits of the invention.

FIG. 3 shows an electronic circuit 300 in the same view as the prior art circuit 200 of FIG. 2. In FIG. 3, as well as in the following figures, the reference numbers from FIG. 2 have been retained for corresponding components. The electronic circuit 300 comprises a grounding network which is connected to the ground plane 213 and which is also connected to the tie-bar 120, so that the tie-bar 120 is thereby connected to the ground plane 213.

In the particular embodiment 300 of FIG. 3, the grounding network comprises a layer of conducting material, a pad or "tongue" 235, which is arranged on the first main surface 211 of the layer 220 so that the tie-bar 120 overlaps the tongue 235 without coming into physical contact with it. Since both the tie-bar 120 and the tongue 235 are made of conducting material, they will couple to each other in a capacitive manner, i.e. in a non-touching manner. The tongue 235 is then connected to the ground plane 213 by means of a resistor 240 and a second tongue or pad 245 which is connected to the ground plane 213 by means of a via connection 230, i.e. the second tongue or pad 245 is grounded by means of a galvanic connection 230. Naturally, other kinds of galvanic connections between the second tongue or pad 245 and/or other parts of the grounding network are also possible, such as, for example, so called bonding wires outside of the layer 220.

The resistance value of the resistor 240 is chosen so as to maximize the power absorbed by the resistor, since this will minimize the Q-value of the resonance in the tie-bar and lead to a suppression of leakage between the I/O ports in the QFN package For optimum damping of the resonance, the resistance value is typically of the order 10 Ohm, although the invention works within a wide interval, so that an order of magnitude smaller or bigger will also work well, i.e. typically within the interval of 1-100 Ohm.

Figure 4:
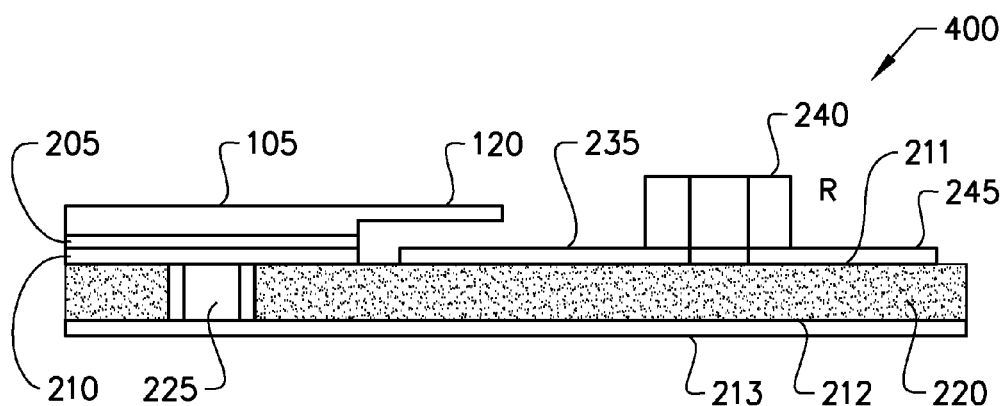

In a further embodiment 400, shown in FIG. 4, the grounding network is connected to the ground plane 210 in a capacitive manner: as shown in FIG. 4, the second tongue 245 is in this embodiment arranged on the first main surface 211 of the non-conducting layer 220, and thereby couples to the ground plane 213 in a non-touching manner, i.e. capacitively through the layer 220.

Figure 5:
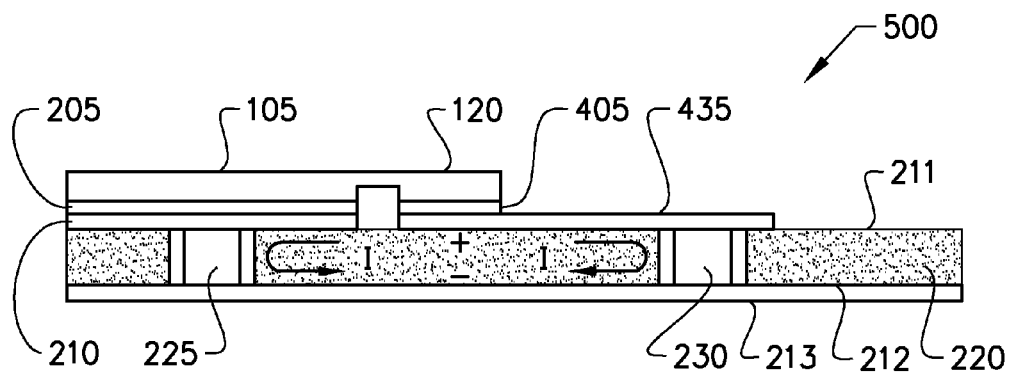

In the embodiments shown in FIGS. 3 and 4, the tie-bar 120 connects capacitively to the grounding network. Another manner of letting the tie-bar 120 connect to the grounding network is shown in the embodiment 500 of FIG. 5: here, the tie-bar 120 is connected to the grounding network by galvanic means, such as, for example, a soldering 405, which connects to the grounding network. In the embodiment of FIG. 5, the grounding network comprises a single layer or "tongue" 435 of conducting material arranged on the first main surface 211 of the non-conducting layer 220. The tongue 435 is then connected to the ground plane 213 galvanically, e.g. by means of a via hole connection 230, or by means of (not shown) bonding wires.

Figure 6:
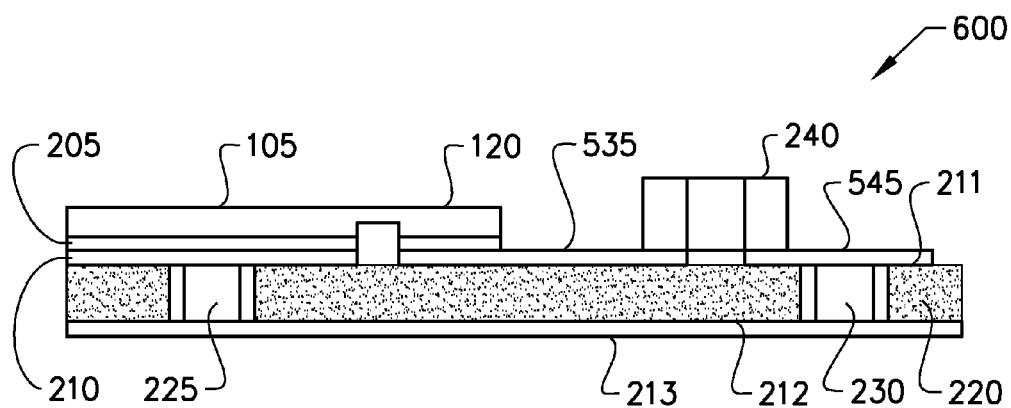

A further embodiment 600 in which the grounding network is connected to the ground plane galvanically is shown in FIG. 6: in this embodiment, the grounding network has been designed in a manner which in a way is similar to that of the embodiments of FIGS. 3 and 4: the grounding network here comprises a first tongue 535 which is soldered or attached galvanically in some other manner to the tie-bar 120. The grounding network also comprises a second tongue 545 connected to the first tongue by means of a resistor 240. Both tongues 535, 545, as well as the resistor 240, are suitably arranged on top of the first main surface 211 of the layer of non-conducting material 220. The second tongue 545 is then connected galvanically to the ground plane 213 by means of a via connection 230, or by means of (not shown) bonding wires.

Figure 7:
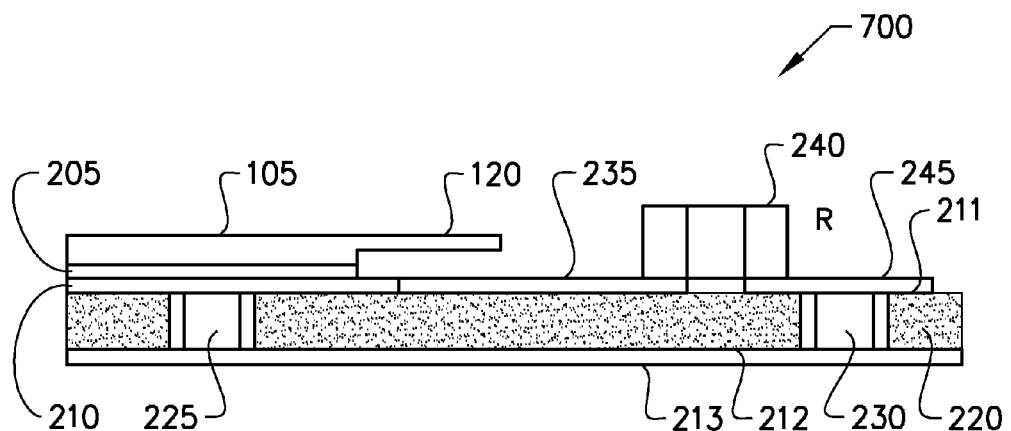

FIG. 7 shows another embodiment 700 in which the central ground pad 210 is in mechanical contact with the tongue 235, which then connects to the rest of the grounding network in the same manner as that shown in FIGS. 3 and 4. In this embodiment, there will be a combination of inductive and capacitive couplings between the tie-bar 120 and the grounding network.

Naturally, in further embodiments, the grounding network of the embodiments of FIGS. 5, 6 and 7 can also be arranged to be coupled to the ground plane 213 capacitively, i.e. in a "non-touching" manner through the layer 220 of non-conducting material.

In those embodiments in which the grounding network is connected galvanically to the ground plane 213, the connection is suitably carried out by a connection means, i.e. vias, bonding wires etc, which have a so called dissipative loss in order to reduce the Q-value of the tie-bar resonance.

Also, embodiments have been shown above in which the grounding network is connected to the ground plane by means of a resistor 240. Naturally, the resistor 240 can be replaced by an inductor or a capacitor, or the connection to the ground pane can be made by means of a combination of any of those elements, i.e. resistor/capacitor/inductor.

In general, the grounding network connects to the protrusion or protrusions (tie bars) by means of any kind of electromagnetic coupling—including a mix of inductive and capacitive coupling—and including touching or non-touching.

It is also possible to include an impedance matching network in the grounding network, for the purpose of increasing the transfer of power from the tie-bar to the lossy parts or components of the grounding network.

In the drawings and specification, there have been disclosed exemplary embodiments of the invention. However, many variations and modifications can be made to these embodiments without substantially departing from the principles of the present invention. Accordingly, although specific terms are employed, they are used in a generic and descriptive sense only and not for purposes of limitation.

The invention is not limited to the examples of embodiments described above and shown in the drawings, but may be freely varied within the scope of the appended claims.

The invention claimed is:

1. An electronic circuit comprising:
   a flat circuit board comprising:
      a layer of a non-conducting material with opposing first and second main surfaces;
      a ground pad arranged on a part of the first main surface; and
      a ground plane arranged on the second main surface so as to protrude beyond the ground pad;
   a flat no leads package arranged on the ground pad, the flat no leads package comprising a conductive plate which comprises one or more protrusions which protrude from the plate beyond the ground pad and overlap the ground plane;
   a grounding network which is electrically connected to both the ground plane and to at least one of the protrusions, thereby electrically connecting the at least one protrusion to the ground plane;
   wherein the grounding network is connected to the protrusion via a portion thereof which is arranged on the layer of non-conducting material so as to be overlapped by the protrusion in spaced relation thereto, thereby providing a capacitive non-touching electrical coupling to the protrusion.

2. The electronic circuit of claim 1, wherein the grounding network is electrically connected to the ground plane via a capacitive non-touching electrical coupling to the ground plane.

3. The electronic circuit of claim 1, wherein the grounding network is electrically connected to the ground plane by means of a galvanic coupling to the ground plane.

4. The electronic circuit of claim 3, wherein the galvanic coupling is a via hole connection through the layer of non-conducting material.

5. The electronic circuit of claim 1, wherein the grounding network is electrically connected to the ground plane via a resistor.

6. The electronic circuit of claim 1, wherein the grounding network is electrically connected to the ground plane via an inductor.

7. The electronic circuit of claim 1, wherein the grounding network is electrically connected to the ground plane via a capacitor.

* * * * *